(12) United States Patent
Matsuzaki et al.

(10) Patent No.: US 8,617,951 B2
(45) Date of Patent: Dec. 31, 2013

(54) METHOD OF MANUFACTURING A SEMICONDUCTOR MEMORY DEVICE HAVING A FLOATING GATE

(75) Inventors: Tomokazu Matsuzaki, Kanagawa (JP); Makoto Sasaki, Kanagawa (JP); Masakuni Shimizu, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 258 days.

(21) Appl. No.: 12/078,296

(22) Filed: Mar. 28, 2008

(65) Prior Publication Data
US 2008/0242026 A1  Oct. 2, 2008

(30) Foreign Application Priority Data

Mar. 30, 2007 (JP) ................................. 2007/091125

(51) Int. Cl.
*H01L 21/8238*  (2006.01)
*H01L 21/336*  (2006.01)
*H01L 21/3205*  (2006.01)

(52) U.S. Cl.
USPC ........... 438/264; 438/257; 438/262; 438/201; 438/211; 438/593; 438/594

(58) Field of Classification Search
USPC ....................................................... 438/264
See application file for complete search history.

(56) References Cited

U.S. PATENT DOCUMENTS

| | | | | |
|---|---|---|---|---|
| 5,029,130 A | * | 7/1991 | Yeh | 365/185.31 |
| 5,414,286 A | * | 5/1995 | Yamauchi | 257/315 |
| 6,284,596 B1 | * | 9/2001 | Sung et al. | 438/257 |
| 6,329,685 B1 | * | 12/2001 | Lee | 257/314 |
| 6,369,420 B1 | * | 4/2002 | Yeh et al. | 257/316 |
| 6,429,075 B2 | * | 8/2002 | Yeh et al. | 438/260 |
| 6,563,167 B2 | * | 5/2003 | Chern | 257/316 |

(Continued)

FOREIGN PATENT DOCUMENTS

| | | |
|---|---|---|
| JP | 2004-200181 | 7/2004 |
| JP | 2004-214411 | 7/2004 |
| JP | 2004-214411 A | 7/2004 |
| JP | 2005-294337 A | 10/2005 |

OTHER PUBLICATIONS

Tip definition—http://www.merriam-webster.com/dictionary/tip.*

(Continued)

*Primary Examiner* — Julio J Maldonado
*Assistant Examiner* — Cory Eskridge
(74) *Attorney, Agent, or Firm* — McGinn IP Law Group, PLLC

(57) ABSTRACT

A method of manufacturing a semiconductor memory device which includes forming a conductive layer for a floating gate above a semiconductor layer intervening a gate insulating film therebetween, then, forming, over the conductive layer, a first spacer comprising a first silicon oxide material and a second spacer adjacent with the first spacer and comprising a second silicon oxide material, the second silicon oxide material having an etching rate lower than that of the first silicon oxide material, selectively removing the conductive layer by using the first and the second spacers as a mask, and removing the first spacer to expose a portion of the conductive layer. Since the etching rate for the second spacer is lower compared with the etching rate for the first spacer, the etching amount of the second spacer caused upon removal of the first spacer can be suppressed and, as a result, the productivity and the reliability of the semiconductor memory device can be improved.

18 Claims, 10 Drawing Sheets

(56) References Cited

U.S. PATENT DOCUMENTS 6,621,115 B2 * 9/2003 Jenq et al. .................... 257/314
6,727,144 B2 * 4/2004 Hashimoto .................. 438/257
7,015,538 B2 * 3/2006 Yoshino et al. .............. 257/317
2008/0242026 A1 * 10/2008 Matsuzaki et al. ........... 438/264

OTHER PUBLICATIONS

Japanese Office Action dated May 22, 2012 with a partial English translation thereof.

* cited by examiner

METHOD OF MANUFACTURING A SEMICONDUCTOR MEMORY DEVICE HAVING A FLOATING GATE

BACKGROUND OF THE INVENTION

1. Field of the Invention

The present invention concerns a method of manufacturing a semiconductor memory device and, more in particular, it relates to a method of manufacturing a non-volatile semiconductor memory device having floating gate.

2. Description of Related Art

As a non-volatile semiconductor memory device capable of retaining stored date even after a power source is turned off, a non-volatile semiconductor memory device having a floating gate has been known. Such a non-volatile semiconductor memory device can write and erase stored data by accumulating and discharging electric charges to and from the floating gate.

Further, a split gate non-volatile semiconductor memory device has been proposed as a sort of a non-volatile semiconductor memory device having the floating gate (for example, refer to JP-A-2004-200181 and JP-A-2004-214411). FIG. 10 shows a split gate non-volatile semiconductor memory device described in JP-A-2004-200181.

As shown in FIG. 10, a source diffusion region 32 and a drain diffusion region 33 are formed to the surface layer of a silicone substrate 31. Further, a floating gate 35 is formed by way of a gate oxide film 34 above the silicon substrate 31. A control gate 36 is electrically insulated by a tunnel oxide film 37 from the floating gate 35. A portion of the floating gate 35 opposed to the control gate 36 has a shape pointed at a distal end (Tip portion 35a).

In the split gate non-volatile semiconductor memory device shown in FIG. 10, writing is carried out by injection of hot electrons generated by a high-voltage applied between the source diffusion region 32 and the drain diffusion region 33 to the floating gate 35 surmounting the energy barrier from the surface of the silicon substrate 31 to the oxide film. Further, erasing is carried out by drawing out the electrons injected in the floating gate 35 to the control gate 36. Particularly, a strong electric field is generated at the periphery of the Tip portion 35a due to the shape thereof and the electrons move mainly from the Tip portion 35a to the control gate 36. As described above, the Tip portion 35a improves the efficiency of the drawing out the electrons upon erasing.

Then, a method of manufacturing the split gate non-volatile semiconductor memory device shown in FIG. 10 is to be described with reference to FIG. 11. As shown in FIG. 11A, a first NSG spacer 39 and a second NSG spacer 40 are formed above a polysilicon film 38 for a floating gate. The first NSG spacer 39 is formed by etching back a tetraethoxy silane (TEOS)-Nondoped Silicate Glass (NSG) film and then shrunk fit by an annealing treatment to form a dense film. On the other hand, while the second NSG spacer 40 is formed in the same manner by etching back a TEOS-NSG film but subsequent annealing treatment is not applied. That is, the second NSG spacer 40 is formed as a film coarser than the first NSG spacer 39.

Further, an opening is formed to a portion of the polysilicon film 38, and the source diffusion layer 32 is formed corresponding to the opening. An insulative film is formed on the lateral surface and the upper portion of a polysilicon plug 41 above the source diffusion region 32. The insulative film on the lateral surface is formed by etching back the TEOS-NSG film, and the insulative film on the upper portion is formed by a thermal oxidation treatment.

Then, as shown in FIG. 11B, the polysilicon film 38 is selectively removed by using the first NSG spacer 39, the second NSG spacer 40, and the insulative film on the upper portion of the polysilicon plug 41 as a mask. The polysilicon film 38 left just below the first NSG spacer 39 and the second NSG spacer 40 by the etching constitutes the floating gate 35.

Then, as shown in FIG. 11C, the first NSG spacer 39 is removed by using a 5% hydrofluoric acid. Thus, the Tip portion 35a of the floating gate 35 is exposed.

Then, after forming the tunnel oxide film 37 so as to cover the exposed Tip portion 35a, a polysilicon film for the control gate is formed over the entire surface. Then, the control gate 36 is formed by etching back on the side wall of the second NSG spacer 40 and the floating gate 35 by way of the tunnel oxide film 37. Successively, an oxide film is formed over the entire surface and a sidewall insulative film is formed on the side wall of the control gate 36 by etching back. Then, after forming the drain diffusion region 33 by ion injection, the upper portion of the control gate 36 and the surface of the drain diffusion region 33 are silicided. As described above, the split gate non-volatile semiconductor memory device shown in FIG. 10 is formed.

Further, JP-A-2004-214411 discloses a method of manufacturing a split gate non-volatile semiconductor memory device different from that of JP-A-2004-200181. While the two spacers formed above the floating gate are formed only of the oxide film (NSG film) in JP-A-2004-200181, it is formed of a silicon oxide film and a silicon nitride film in JP-A-2004-214411. Further, in the manufacturing method of JP-A-2004-200181, while a sacrificial layer formed of a silicon nitride film is used on one side of the first NSG spacer before the step in FIG. 11A, a sacrificial layer formed of a polysilicon film is used in JP-A-2004-214411. Accordingly, the method of manufacturing the split gate non-volatile semiconductor memory device of JP-A-2004-214411 requires several additional manufacturing steps compared with that of JP-A-2004-200181 to result in a problem that the manufacturing cost is increased.

As shown in FIG. 10, the upper portion of the control gate 36 and surface layer of the drain diffusion region 33 are silicided for lowering the resistance. In this case, a side wall insulative film is formed on the side wall of the control gate 36 such that silicides are not short circuited to each other (silicide short circuit). That is, unless the side wall insulative wall is formed to a sufficient height, silicide short circuit may possibly occur. As described above, since the side wall insulative film is formed as the side wall of the control gate 36 by etching back, the height of the side wall insulative film depends on the height of the control gate 36. Further, since the control gate 36 is formed as the side wall of the second NSG spacer 40 by etching back, the height of the control gate 36 depends on the height of the second NSG spacer 40.

However, as shown in FIG. 11C, the first NSG spacer 39 is removed by wet etching using the 5% hydrofluoric acid.

The present inventor has recognized that since the upper portion of the second NSG spacer 40 is also exposed in this case, the second NSG spacer 40 is also etched simultaneously. Particularly, in JP-A-2004-200181, the first NSG spacer 39 is formed of a dense film and the second NSG spacer 40 is formed of the coarse film. That is, the etching rate for the second NSG spacer 40 is higher than the first NSG spacer 39. Therefore, since etching to the upper portion of the second NSG spacer 40 proceeds during removal of the first NSG spacer 39 and, as a result, the side wall insulating film is formed, this results in a problem that the necessary height for the second NSG spacer 40 cannot be ensured.

SUMMARY

The present invention seeks to solve one or more of the above problems, or to improve upon those problems at least in part.

In one embodiment, a method of manufacturing a semiconductor memory device includes forming a conductive layer for a floating gate above a semiconductor layer intervening a gate insulating film therebetween, forming a first spacer comprising a first silicon oxide material and a second spacer adjacent with the first spacer and comprising a second silicon oxide material, the second silicon oxide material having an etching rate lower than that of the first silicon oxide material, over the conductive layer, selectively removing the conductive layer by using the first and the second spacers as a mask, and removing the first spacer to expose a portion of the conductive layer.

As described above, since the etching rate for the second spacer is lower compared with the etching rate for the first spacer, the etching amount for the second spacer generated during removal of the first spacer can be suppressed. That is, since the height of the second spacer can be ensured sufficiently, the height of the control gate formed on the side wall of the second spacer can also be ensured sufficiently. As a result, the side wall insulative film formed on the side wall of the control gate can be formed at a height sufficient to prevent silicide short circuit thereby enabling to improve the productivity and the reliability of the semiconductor memory device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

1. Structure

Figure 1A:
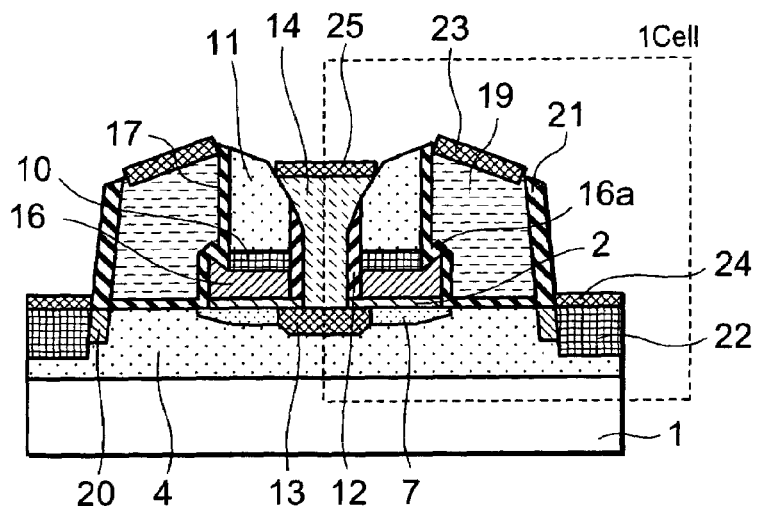
FIG. 1A is a cross sectional view showing the structure of a split gate non-volatile semiconductor memory device according to a first embodiment.
Figure 1B:
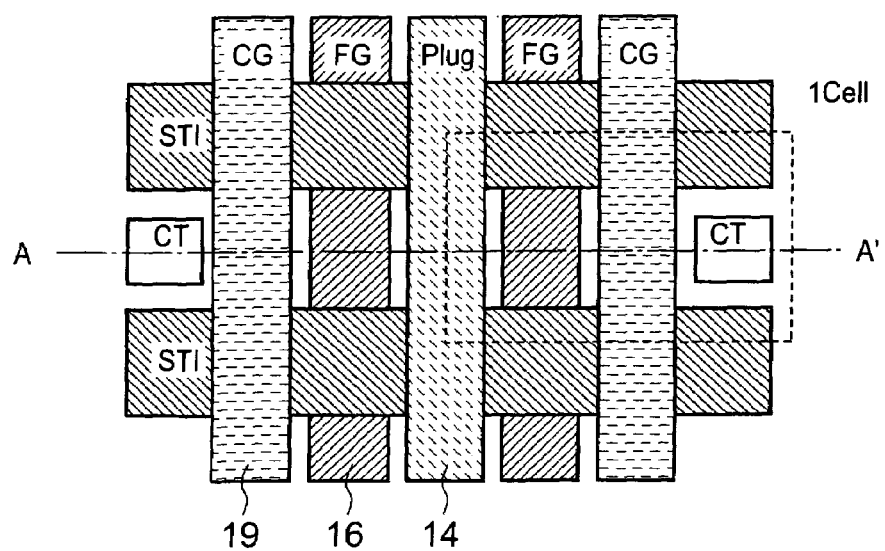
FIG. 1B is a plan view (planar layout) thereof.

FIG. 1A is a cross sectional view showing the structure of a split gate non-volatile semiconductor memory device according to the first embodiment of the invention, and FIG. 1B shows a planar view (planar layout) when observing the device from above, respectively. The cross section in FIG. 1A corresponds to the cross section along A-A' in FIG. 1B. Further, FIG. 1A and FIG. 1B show two memory cells and memory cell transistors are arranged symmetrically with respect to a common plug 14. A portion surrounded with a dotted line corresponds to a memory cell by the number of one (1 cell), which can store 1 bit data.

As shown in FIG. 1A, a P-well 4 as a P-type well and a first source/drain diffusion region 13 and a second source/drain diffusion region 22 which are N-impurity regions and constituting a source or a drain are formed respectively over a silicone substrate 1 as a semiconductor substrate. The plug 14 is formed above the first source/drain diffusion region 13, and a first plug insulative film 12 is formed on both sides of the plug 14.

Further, floating gates (FG) 16 are formed on both sides of the plug 14 putting first plug insulative films 12 therebetween. That is, the first plug insulative film 12 has a role for electric isolation between the plug 14 and the FG 16. A gate insulative film 2 is formed between the FG 16 and the silicon substrate 1. The FG 16 overlaps a portion of the first source/drain diffusion region 13, and the FG 16 and the first source/drain diffusion region 13 constitute capacitive coupling through the gate insulative film 2. Further, a second spacer 11 formed of a high temperature oxide film is formed above the FG 16. Further, a tunnel insulative film 17 is in contact with the end of the FG 16 not in contact with the first plug insulative film 12. As described above, the FG 16 is surrounded with the first plug insulative film 12, the gate insulative film 2, the second spacer 11, and the tunnel insulative film 17 and electrically isolated from the outside. The threshold voltage of the memory cell changes depending on the amount of electric charges held in the FG 16.

Further, a control gate (CG) 19 is formed to the FG 16 at a position on the side opposite to the plug 14. Further, a portion of the CG 19 is formed so as to cover a tip portion 16a in a pointed shape of the FG 16 extending in the direction from the FG 16 to the CG 19 and most of the remaining portion is formed above the silicon substrate 31. The tunnel insulative film 17 is interposed not only between the CG 19 and the FG 16 but also between the CG 19 and the silicon substrate 1. As described above, the memory cell according to the first embodiment has a memory structure capable of preventing the occurrence of an error due to excess erasing. Further, with an aim of lowering the resistance, the upper portion of the CG 19, the surface of the second source/drain region 22, and the upper portion of the plug 14 are silicided to form a first silicide layer 23, a second silicide layer 24, and a third silicide layer 25 respectively. The silicide layer 23 and the silicide layer 24 are separated by the side wall insulative film 21 so that they are not short circuited.

Further, it can be seen that the FG 16, the CG 19, the plug 14, the first plug insulative film 12, and the second spacer 11 in the memory cell of the split gate non-volatile semiconductor memory device shown in FIG. 1A are formed by self-alignment. Such structural features are obtained by the inherent manufacturing method to be described later.

As shown in FIG. 1B, the plug 14, the FG 16, and the CG 19 are formed in a direction perpendicular to the direction of the cross section (A-A') in FIG. 1A, and the FG 16 and the CG 19 are arranged symmetrical with the plug 14. On the other hand, a shallow trench isolation (STI) as a device isolation region is formed in the direction parallel to the direction of the cross section (A-A') in FIG. 1A intending for electrical device isolation. In the planar layout in FIG. 1B, it can be seen that FG 16 is isolated by STI.

2. Operation

Then, the operation of the split gate non-volatile semiconductor memory device according to the first embodiment (wiring, erasing, and reading) is to be described. Writing is carried out by injection of source side channel hot electrons (CHE). In this case, the first source/drain diffusion region 13 functions as a drain, and the second source/drain diffusion region 22 functions as a source respectively. For example, a voltage at +1.6 V is applied to the CG 19, a voltage at +7.6V is applied to the first source/drain diffusion region 13, a voltage at 0.3V is applied to the second source/drain diffusion region 22. Electrons discharged from the second source/drain diffusion region 22 are accelerated by a strong electric field in the channel region to be formed into CHE. Particularly, the potential at the FG 16 is also made higher by capacitive coupling between the first source/drain diffusion region 13 and the FG 16, and a strong electric field is generated to a narrow gap between the CG 19 and the FG 16. CHE at high energy generated by the strong electric field are injected through the gate insulative film 2 to the FG 16. Such injection is referred to as source side injection (SSI) and SSI can improve the electron injection efficiency thereby enabling to set the application voltage lower. Injection of the electrons to the FG 16 increases a threshold voltage of the memory cell.

Erasing is carried out by a Fowler Nordheim (FN) tunnel system. For example, a voltage at +12.0 is applied to the CG 19, and the voltage for the first source/drain diffusion region 13, the second source/drain diffusion region 22, and the silicon substrate 1 are set to 0V. As a result, a high electric field is applied to the tunnel insulative film 17 between the CG 19 and the FG 16, and FN tunnel current flows. Thus, the electrons in the FG 16 are drawn through the tunnel insulative film 17 to the CG 19. Particularly, a stronger electric field is generated at the periphery of the tip portion 16a of the FG 16 due to the pointed shape thereof and the electrons in the FG 16 are mainly discharged from the tip portion 16a to the CG 19. It can be said that the Tip portion 16a at which the strong electric field is generated improves the drawing efficiency of the electrons. By the drawing of the electrons from the FG 16, the threshold voltage of the memory cell is decreased.

In a case where the threshold voltage regarding the FG 16 becomes negative by excessive erasing, a channel can always be generated below the FG 16. However, since the CG 19 is also disposed above the channel region, this can prevent the memory cell from being always in the turned-on state. As described above, the memory cell of the first embodiment has an advantage capable of preventing excess erasing error.

Upon reading, the first source/drain diffusion region 13 functions as a source and the second source/drain diffusion layer 22 functions as a drain respectively. For example, a voltage at +2.7V is applied to the CG 19, a voltage at +0.5V is applied to the second source/drain diffusion region 22, and the voltage for the first source/drain diffusion region 13 and the silicone substrate 1 is set to 0V. In a case of an erasing cell, the threshold voltage is low and a reading current Icell flows. On the other hand, in a case of writing (program) cell, the threshold voltage is high and the reading current Icell scarcely flows. By the detection of the reading current Icell, it can be judged whether the cell is a program cell or an erasing cell.

3. Manufacturing Method

FIG. 2 to FIG. 9 are cross sectional views showing the method of manufacturing the split gate non-volatile semiconductor memory device according to the first embodiment. The drawings show cross sections along line A-A' in FIG. 1B.

Figure 2A:
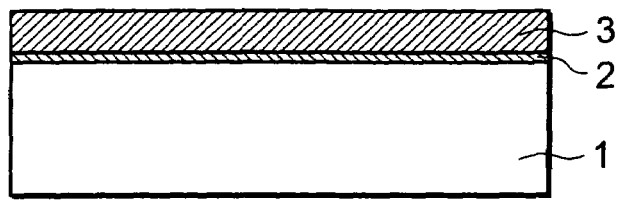
FIG. 2A to FIG. 2C are cross sectional views along line A-A' in FIG. 1B showing manufacturing steps of the split gate non-volatile semiconductor memory device according to the first embodiment.

At first, as shown in FIG. 2A, a gate oxide film 2 as an insulative film is formed to a thickness, for example, of 100Å on a silicone substrate 1. Successively, an FG thin film 3 as a conductor film (for example, a polysilicon thin film) is formed over the gate oxide film 2. Then, STI as a device isolation region is formed in parallel with A-A' in FIG. 1B and along a cross section not illustrated in FIG. 2A by using a customary STI processing technique.

Figure 2B:
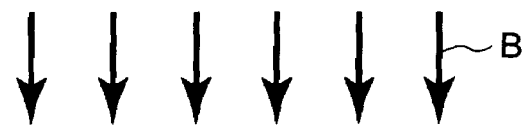
Figure 2B:
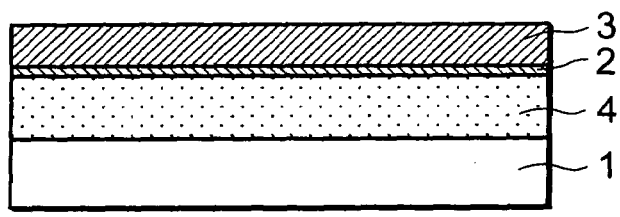

Then, as shown in FIG. 2B, ions of P-type impurity (for example, boron (B)) are injected to the entire surface to form a P well 4 in the silicon substrate 1.

Figure 2C:
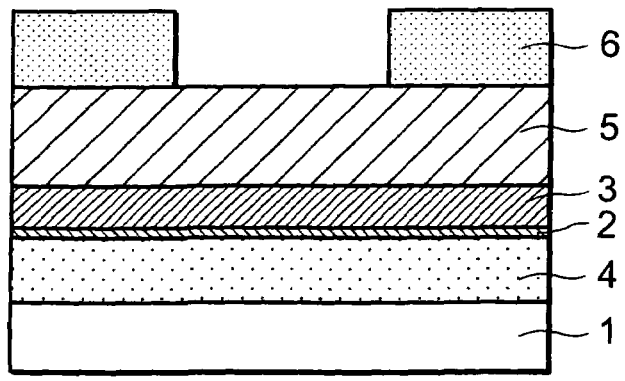

Then, as shown in FIG. 2C, a silicon nitride film 5 as a sacrificial layer is formed, for example, by LPCVD on the FG thin film 3 to a thickness, for example, of from 3,500 to 4,000 Å. The thickness of the silicon nitride film 5 is a parameter for determining the height of the side wall insulative film 21. While described specifically in the description for the subsequent steps, the side wall insulation film 21 is formed by etching back on the sidewall of the CG 16. Further, the CG 16 is formed by etching back on the side wall of the second spacer 11 by etching back. Then, the second spacer 11 is formed to the side wall of the silicon nitride film 5 by etching back. That is, in a case where the thickness of the silicon nitride film 5 formed at first is excessively thin, the side wall insulative film 21 of a necessary height cannot be obtained. For preventing silicide short circuit, it is necessary that the height of the side wall insulative film 21 is, for example, 1,600 Å and, for this purpose, it is necessary that the thickness of the silicon nitride film 5 is, for example, from 3,500 to 4,000 Å.

Then, a photoresist film 6 is coated on the silicon nitride film 5. Successively, the photoresist film 6 is patterned by lithography to form a mask pattern having an opening.

Figure 3A:
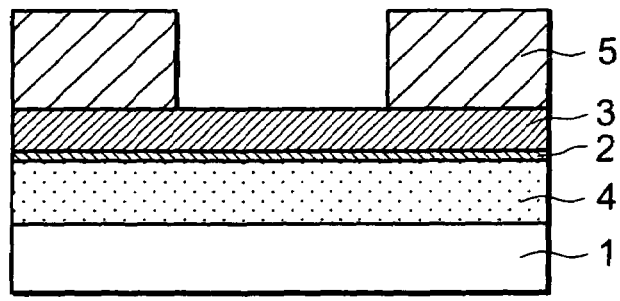
FIG. 3A to FIG. 3C are cross sectional views along line A-A' in FIG. 1B showing manufacturing steps of the split gate non-volatile semiconductor memory device according to the first embodiment.

Then, as shown in FIG. 3A, anisotropic dry etching is carried out to the silicon nitride film 5 using the patterned photoresist film 6 as a mask. As a result, an opening is formed to the silicon nitride film 5. Then, the photoresist film 6 on the silicon nitride film 5 is removed by ashing.

Figure 3B:
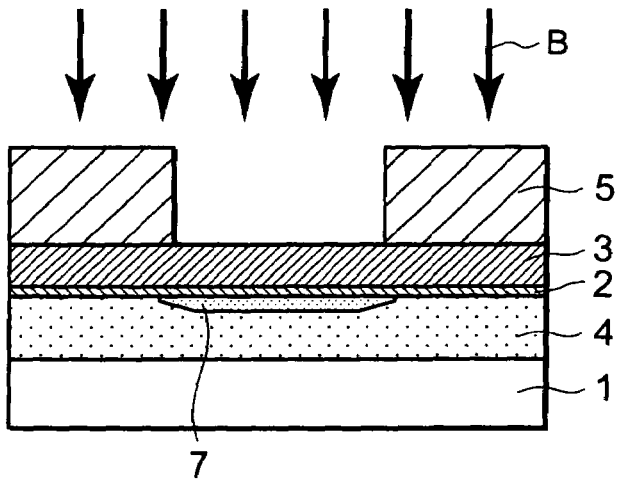

Then, as shown in FIG. 3B, P-type impurity (for example, boron) is selectively injected by ion injection over the entire surface to form a P-type impurity diffusion region 7 for controlling the threshold voltage.

Figure 3C:
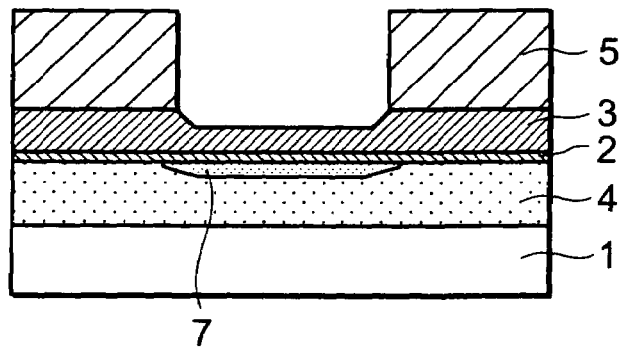

Then, as shown in FIG. 3C, a portion of the FG thin film 3 is removed by dry etching using the silicon nitride film 5 as a mask. The end of the FG thin film 3 removed with a portion is in a sloped shape to form a Tip portion 16a of the FG 16. In the dry etching, under etching may also be carried out so as to extend the sloped shape below the silicon nitride film 5. In this case, the FG thin film 3 is etched in the lateral direction, for example, by about 200 to 300 Å. Further, after the step, the sloped surface of the FG thin film 3 may be thermally oxidized.

Figure 4A:
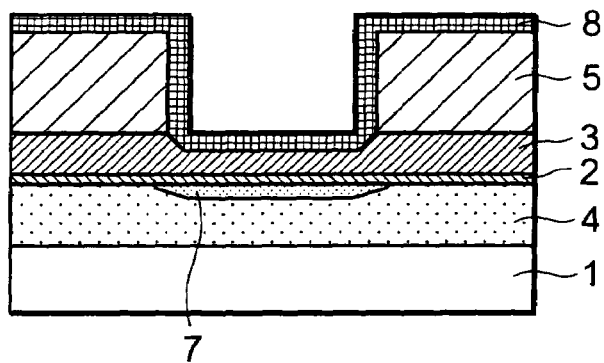
FIG. 4A to FIG. 4C are cross sectional views along line A-A' in FIG. 1B showing manufacturing steps of the split gate non-volatile semiconductor memory device according to the first embodiment.

Then, as shown in FIG. 4A, a TEOS-NSG film 8 which is a non-doped silicate glass (NSG) film as a sort of a silicon oxide film is formed over the entire surface by LPCVD to a thickness, for example, of from 100 to 200 Å. Further, after the step, the TEOS-NSG film 8 may also be shrunk fit by a heat treatment. However, in this case, the shrunk fit TEOS-NSG film 8 is controlled so as not to be harder than the high temperature oxide film 9 to be formed in the next step. That is, it is necessary that the etching rate for the TEOS-NSG film 8 is higher than the etching rate for the high temperature oxide film 9 even when shrink fitting is applied.

Figure 4B:
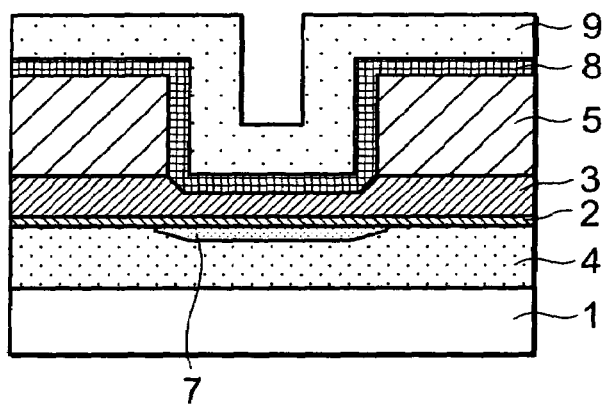

Then, as shown in FIG. 4B, a silicon oxide film is formed as a high temperature oxide film (HTO) 9 on the TEOS-NSG film 8 by CVD at 800° C. to a thickness, for example, of from 1,900 to 2,000 Å.

Figure 4C:
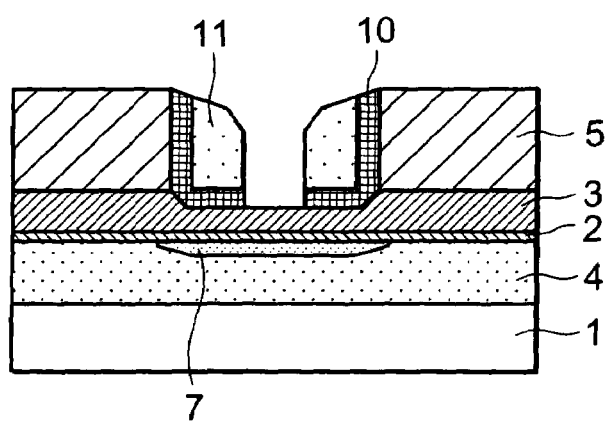

Then, as shown in FIG. 4C, the high temperature oxide film 9 and the TEOS-NSG film 8 are etched back to form a dual layer spacer comprising a first spacer 10 and a second spacer 11 to the side wall of the silicon nitride film 5 in the opening. Since the dual layer film is etched back continuously after forming the TEOS-NSG film 8 and the high temperature oxide film 9, the second spacer 11 is formed on the first spacer 10, and the second spacer 11 is formed on the side wall of the first spacer 10. In other words, the first spacer 10 is formed so as to cover the lower side and one lateral side of the second spacer 11.

The first space 10 and the second spacer 11 may be formed separately. That is, the TEOS-NSG film 8 may be formed and then the first spacer 10 is formed by etching back. Then, the high temperature oxide film 9 may be formed and the second spacer 11 may be formed by etching back.

Further, the second spacer 11 comprising the high temperature oxide film 9 is harder and denser compared with the first spacer 10 formed of the TEOS-NSG film 8. That is, the etching rate for the second spacer 11 is lower than the etching rate for the first spacer 10.

Figure 5A:
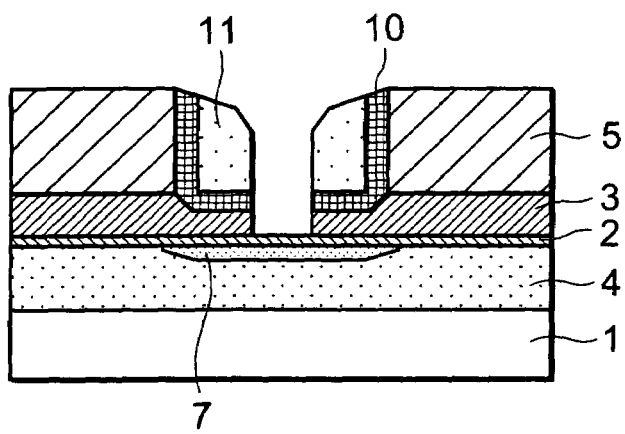
FIG. 5A to FIG. 5C are cross sectional views along line A-A' in FIG. 1B showing manufacturing steps of the split gate non-volatile semiconductor memory device according to the first embodiment.

Then, as shown in FIG. 5A, the FG thin film 3 is selectively removed by dry etching using the silicon nitride film 5, the first spacer 10, and the second spacer 11 as a mask. Thus, the lateral surface on one side of the FG 16 is formed.

Figure 5B:
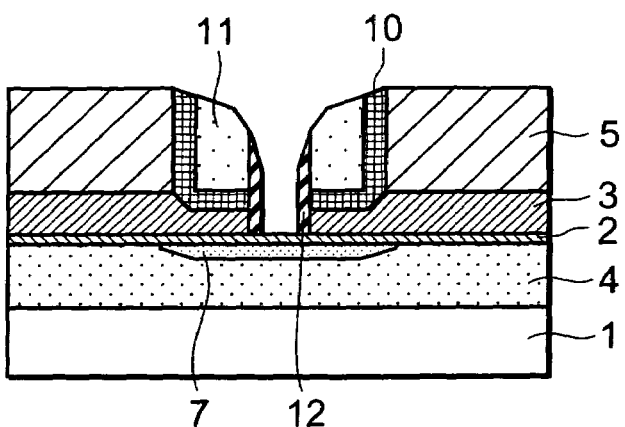

Then, an insulative film (for example, high temperature silicon oxide film) is formed over the entire surface by CVD. Then, etching back is carried out and a first plug insulative film 12 is formed on the side walls of the FG thin film 3, the first spacer 10, and the second spacer 11 in the opening as shown in FIG. 5B.

Figure 5C:
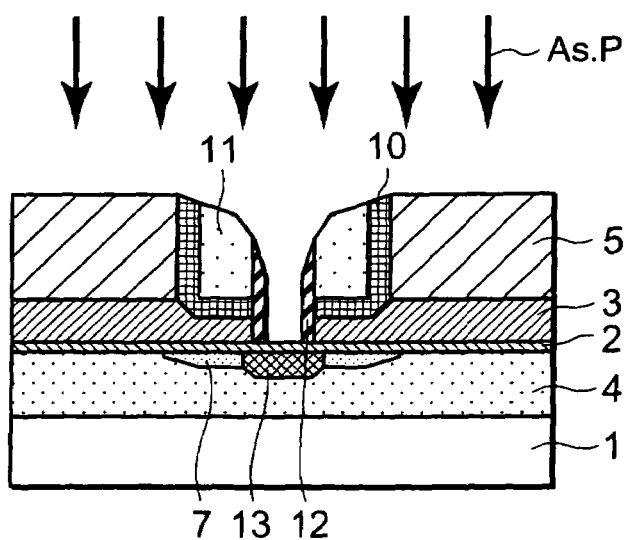

Then, as shown in FIG. 5C, ion injection of arsenic and phosphor (P) as the N-type impurity is carried out under the conditions, for example, at an injection energy of 40 KeV, and at a dose amount of $5 \times 10^{15}$ $cm^{-2}$ over the entire surface by using the silicon nitride film 5, the first spacer 10, the second spacer 11, and the first plug insulative film 12 as a mask. Thus, the first source/drain diffusion layer 13 is formed in the semiconductor substrate corresponding to the position for the opening.

Figure 6A:
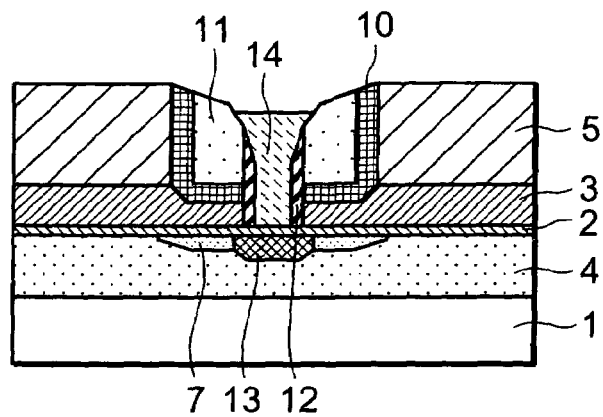
FIG. 6A to FIG. 6C are cross sectional views along line A-A' in FIG. 1B showing manufacturing steps of the split gate non-volatile semiconductor memory device according to the first embodiment.

Then, anisotropic dry etching is carried out by using the silicon nitride film 5, the first spacer 10, the second spacer 11, and the first plug insulative film 12 as a mask to selectively remove the gate oxide film 2 at the opening. Successively, a conductor film (for example, polysilicon film) is formed over the entire surface and Chemical Mechanical Polishing (CMP) is applied. Then, by etching back, a plug 14 formed by burying the conductor film as shown in FIG. 6A.

Figure 6B:
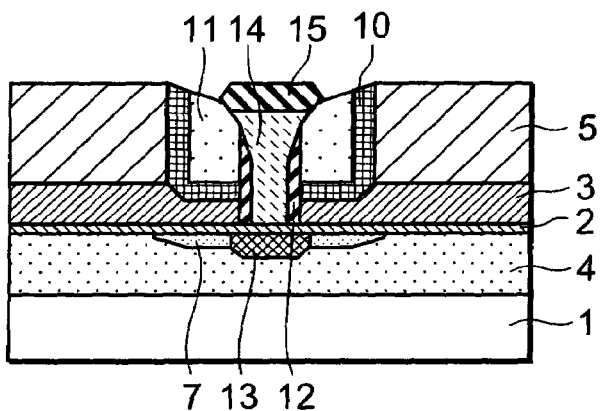

Then, with an aim of promoting oxidation for the upper portion of the plug 14, ion injection of arsenic as the N-type impurity is carried out over the entire surface under the condition, for example, at an injection energy of 40 KeV, and a dose amount of $5 \times 10^{15}$ $cm^{-2}$. Then, as shown in FIG. 6B, a second plug insulative film 15 is formed above the plug 14 by a thermal oxidation treatment.

Figure 6C:
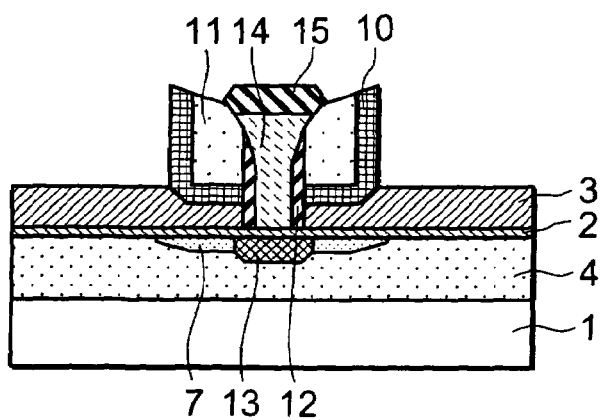

Then, as shown in FIG. 6C, the silicon nitride film 5 as the sacrificial layer is removed by wet etching using phosphoric acid. The wet etching is carried out, for example, by immersion in a solution of $H_3PO_4$ (concentration: 86%) at 160° C. for a predetermined time.

Figure 7A:
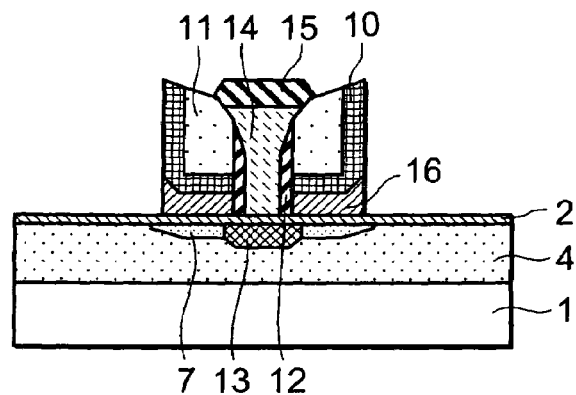
FIG. 7A to FIG. 7C are cross sectional views along line A-A' in FIG. 1B showing manufacturing steps of the split gate non-volatile semiconductor memory device according to the first embodiment.

Then, as shown in FIG. 7A, the FG thin film 3 is removed selectively by dry etching using the first spacer 10, the second spacer 11, and the second plug insulative film 15 as a mask. Thus, the FG thin film 3 left just below the first spacer 10 forms an FG 16.

Figure 7B:
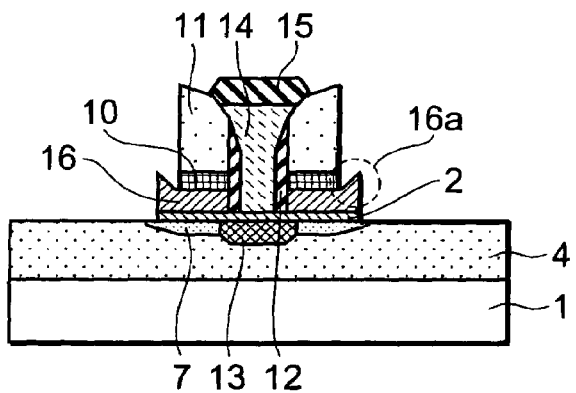

Then, as shown in FIG. 7B, the first spacer 10 formed above the Tip portion 16a of the FG 16 is removed by wet etching. This exposes the Tip portion 16a of the FG 16. Wet etching is carried out by using, for example, a 5% hydrofluoric acid for 30 sec. The first spacer 10 formed below the second spacer 11 is left not being removed.

In the wet etching, since the upper portion of the second spacer 11 is exposed, etching also proceeds to the second spacer simultaneously. However, since the second spacer 11 formed of the high temperature oxide film 9 is harder and denser than the first spacer 10 formed of the TEOS-NSG film 8, the etching rate for the second spacer 11 is lower compared with the etching rate for the first spacer 10. That is, since the wet etching is intended for removing the first spacer 10, the etching amount to the second spacer 11 is suppressed for a short etching time in which the first spacer 10 is removed.

That is, since the selectivity: first spacer 10 (TEOS-NSG film 8)/second spacer 11 (high temperature oxide film 9) is improved in the oxide film etching upon removal of the first spacer 10, this can prevent that the upper portion of the second spacer 11 is lost remarkably by the wet etching. Accordingly, a height of the second spacer 11 capable of obtaining a sidewall insulative film 21 of a necessary height can be ensured.

It is also possible to form the silicon nitride film 5 to a sufficient thickness while considering the etching amount of the second spacer 11 by the wet etching. However, in this case, the opening formed in the silicon nitride film 5 has a high aspect ratio to result in a problem that control for the etching and the film deposition by CVD in the opening becomes difficult in the formation of the spacer or the like. Accordingly, since the thickness of the silicon nitride film 5 cannot be increased more than required, it is important to suppress the amount of loss of the second spacer 11 in the course of the manufacturing step.

Further, in the wet etching, etching is carried out also for other exposed oxide films, e.g., the gate insulative film 2 and the second plug insulative film 15. In this case, the gate oxide film 2 is selectively removed for the exposed portion. On the other hand, the upper portion of the plug 14 is covered with the second plug insulative film 15, and it is not exposed by the wet etching. Further, while it has been explained that the first spacer 10 is removed also by the wet etching, the first spacer 10 may be removed by using dry etching.

Figure 7C:
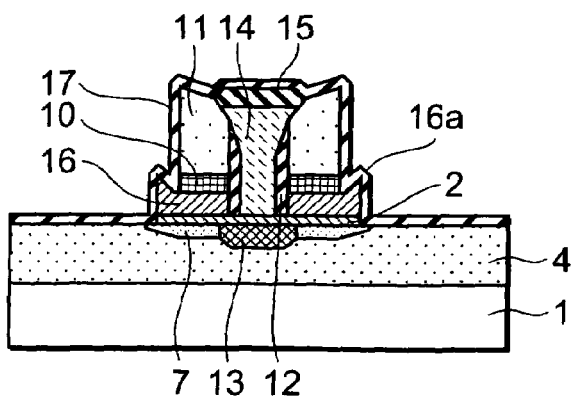

Then, as shown in FIG. 7C, a tunnel insulative film (for example, silicon oxide film) 17 is formed over the entire surface. Since the oxide film at the periphery of the Tip portion 16a has been removed completely in the step shown in FIG. 7B, the tunnel insulative film 17 can be formed uniformly at the periphery of the exposed Tip portion 16a. The tunnel insulative film 17 formed in this region has a role of electrically separating the floating gate 16 and the control gate 19 to be formed by the subsequent step. Further, the tunnel insulative film 17 formed in a region where the removed gate insulative film 2 that has been formed in the step shown in FIG. 7B has a role of electrically separating the silicon substrate 1 and the control gate 19.

Figure 8A:
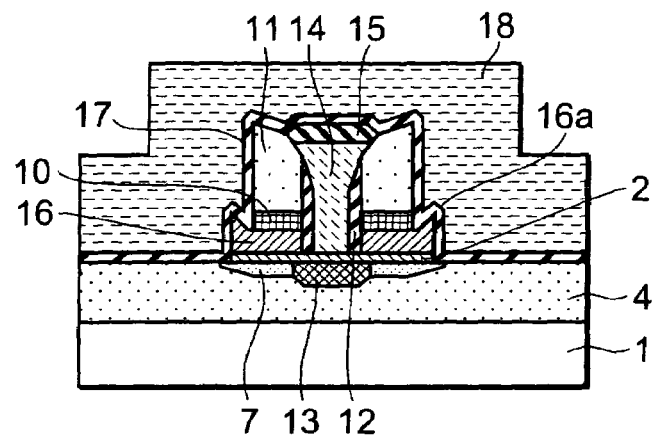
FIG. 8A to FIG. 8C are cross sectional views along line A-A' in FIG. 1B showing manufacturing steps of the split gate non-volatile semiconductor memory device according to the first embodiment.

Then, as shown in FIG. 8A, a CG film (for example, polysilicon film) 18 as a conductor layer is formed over the tunnel insulative film 17.

Figure 8B:
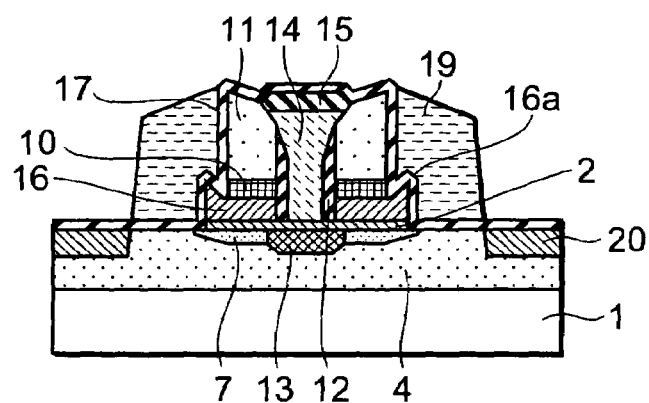

Then, etching back is carried out to the CG film 18. As shown in FIG. 8B, the CG 19 is formed by way of the tunnel insulative film 17 on the sidewalls of the second spacer 11 and the FG 16. Subsequently, an LDD region 20 is formed by ion injection of arsenic.

Figure 8C:
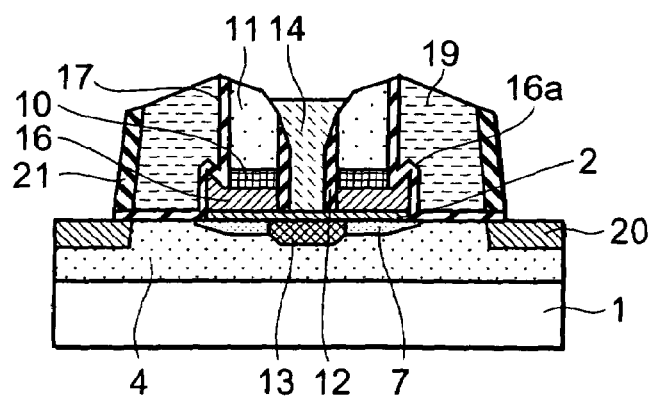

Then, after formation of an insulative film (for example, silicon oxide film) over the entire surface, a side wall insulative film 21 is formed at a height, for example, of 1,600 Å on the side wall of the CG 19 by etching back as shown in FIG. 8C. In this case, the exposed tunnel insulative film 17 and the second plug insulative film 15 are removed simultaneously.

Figure 9:
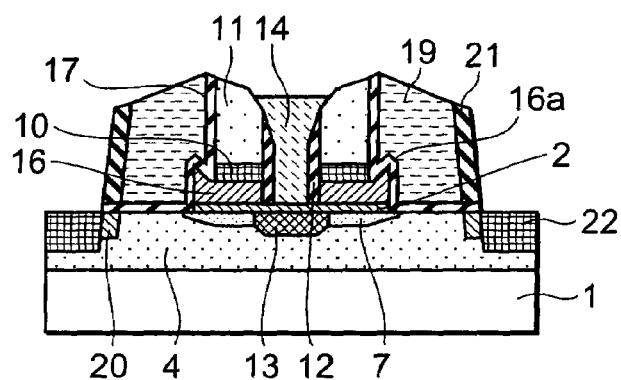
FIG. 9 is a cross sectional view along line A-A' in FIG. 1B showing manufacturing steps of the split gate type non-volatile semiconductor memory device according to the first embodiment.
Figure 10:
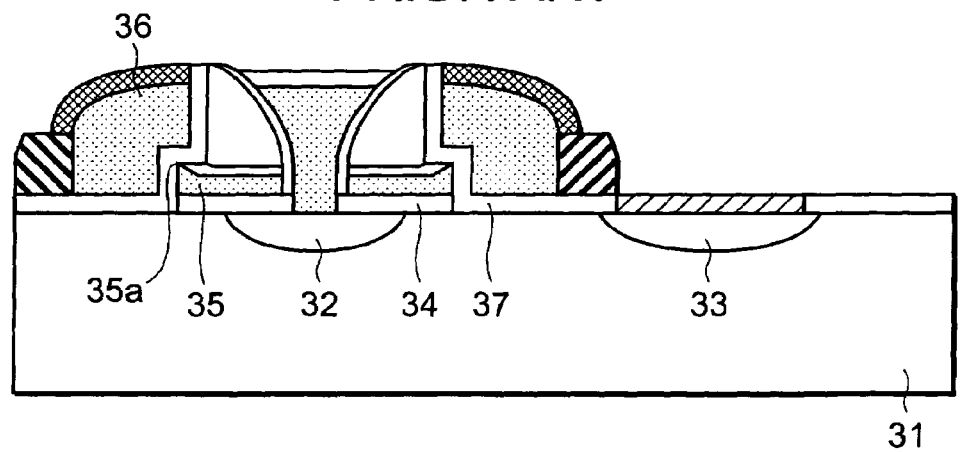
FIG. 10 is a cross sectional view showing the structure of a split gate non-volatile semiconductor memory device according to a prior art.
Figure 11A:
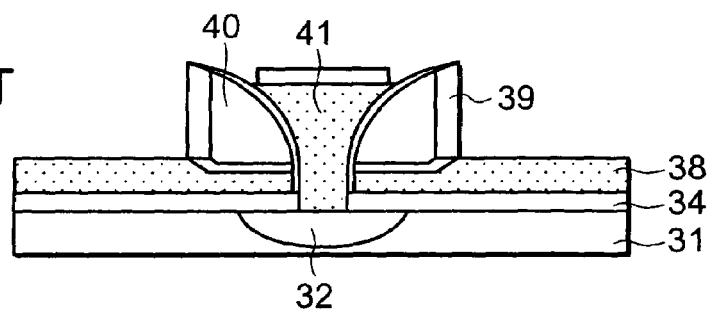
FIG. 11A to FIG. 11C are cross sectional views showing the manufacturing steps for a split gate non-volatile semiconductor memory device according to a prior art.
Figure 11B:
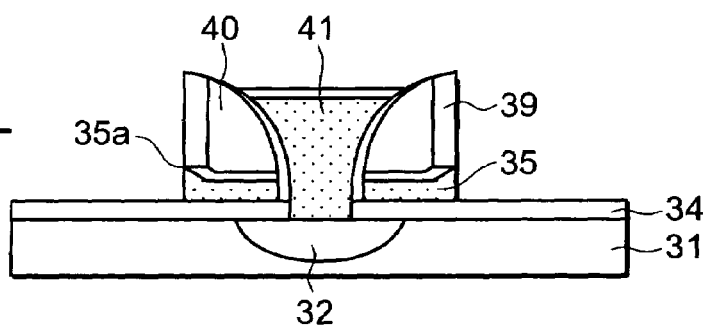
Figure 11C:
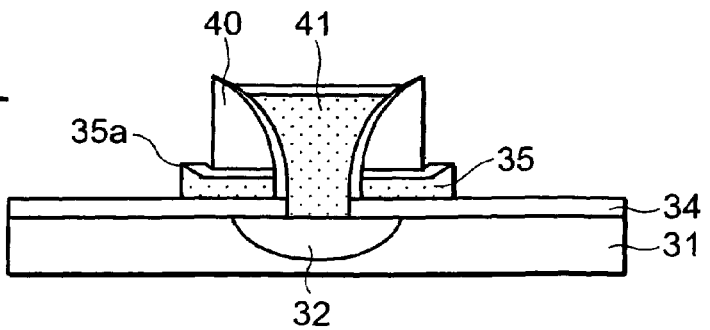

Then, as shown in FIG. 9, ion injection of arsenic and phosphor as the N-type impurity is carried out over the entire surface, to form a second source/drain diffusion region 22.

Then, the upper portion of the CG 19, the surface of the second source/drain diffusion region 22 and the upper portion of the plug 14 are silicided. In this case, since the side wall insulative film 21 of a sufficient height is formed, silicide short circuit between the first silicide layer 23 and the second silicide layer 24 can be prevented. As described above, the split gate non-volatile semiconductor memory device shown in FIG. 1 is formed.

According to the manufacturing process as described above, use of lithography is suppressed as much as possible and most of components are formed by self-alignment in etching back. That is, since the number of using the photolithography is decreased, manufacture is facilitated and the cell size can be decreased.

As described above, in the first embodiment of the invention, since the etching rate for the second spacer 11 is lower than the etching rate for the first space 10, it is possible to suppress the amount of loss of the second spacer 11 by the wet etching upon removal of the first spacer 10. That is, since the height of the second spacer 11 can be ensured sufficiently, the height of the CG 19 formed on the side wall of the second spacer 11 can also be ensured and, as a result, also the side wall insulative film 21 formed on the side wall of the CG 19 can be formed at a sufficient height to prevent silicide short circuit.

While descriptions have been made to the first embodiment as described above, this does not restrict the film forming condition, gases used, materials, etc. Particularly, so long as both of the materials for the first spacer 10 and the second spacer 11 are silicon oxide film (silicon oxide material) and the etching rate for the second spacer 11 is lower when the etching rate for the first spacer and the etching rate for the second spacer 11 are compared, they may be constituted with other materials than those exemplified in the first embodiment. For example, the first spacer 10 may be formed of a low temperature oxide film (LTO) instead of the NSG film. That is, so long as they are in such a relation, the amount of loss of the second spacer 11 can be decreased compared with the existent case and, as a result, occurrence of silicide short circuit can be prevented. That is, the productivity and the reliability of the semiconductor memory device can be improved.

Although invention has been described above in connection with preferred embodiments thereof, it will be appreciated by those skilled in the art that those embodiments are provided solely for illustrating the invention, and should not be relied upon to construe the appended claims in a limiting sense.

What is claimed is:

1. A method of manufacturing a semiconductor memory device, said method comprising:

forming a conductive layer for a floating gate above a semiconductor layer, a gate insulating film being interposed between the conductive layer and the semiconductor layer;

forming a sacrificial layer having an opening on the conductive layer;

removing a portion of the conductive layer by etching using the sacrificial layer as a mask to form an exposed portion of the conductive layer, the exposed portion of the conductive layer having a sloped-shaped portion at a lateral end of the exposed portion, the sloped-shaped portion having a tip portion;

forming a first spacer on the exposed portion of the conductive layer and the opening of the sacrificial layer;

forming a second spacer on the first spacer, the second spacer having an etching rate lower than that of the first spacer;

selectively removing the conductive layer by using the first and the second spacers as a mask;

removing the vertical side portions of the first spacer to expose the sloped-shaped portion of the conductive layer;

forming a tunnel insulative film on the sloped-shaped portion of the conductive layer;

forming a flat portion on the exposed portion of the conductive layer other than on the tip portion of the conductive layer;

forming a second diffusion layer on the semiconductor layer at a position corresponding to the opening;

forming a plug over the second diffusion layer;

siliciding an upper portion of the plug, wherein the first spacer includes a first silicon oxide material and the second spacer includes a second silicon oxide material, wherein an etching rate of the second silicon oxide material is less than an etching rate of the first silicon oxide material;

forming a control gate that is insulated from the conductive layer by the tunnel insulative film;

disposing a first silicide layer on a surface of the control gate;

forming a side wall insulative film on a side surface of the control gate;

forming an active region in the semiconductor layer adjacent a side of the side wall insulative film;

disposing a second silicide layer on the active region;

wherein, following the forming of the first spacer, the forming of the second spacer on the first spacer is performed, wherein following the forming of the second spacer on the first spacer, an etching of the first spacer and the second spacer is performed, and wherein the etching of the first spacer and the second spacer comprises a single etching; and wherein a film thickness of the second spacer above the flat portion of the conductive layer is greater than a film thickness of the first spacer above the flat portion of the conductive layer.

2. The method of manufacturing the semiconductor memory device according to claim 1, wherein the sacrificial layer includes a silicon nitride film.

3. The method of manufacturing the semiconductor memory device according to claim 1, wherein the sacrificial layer is covered by the first and second spacers in the forming of the first and second spacers.

4. The method of manufacturing the semiconductor memory device according to claim 1, wherein a third silicide layer is formed by said siliciding the upper portion of the plug, said tunnel insulating film isolating said first silicide layer from said third silicide layer.

5. The method of manufacturing the semiconductor memory device according to claim 4, wherein an upper surface of the second spacer is exposed.

6. The method of manufacturing the semiconductor memory device according to claim 1, wherein the second spacer is disposed above the first spacer.

7. The method of manufacturing the semiconductor memory device according to claim 1, wherein a bottom surface of the second spacer abuts an upper surface of the first spacer.

8. The method of manufacturing the semiconductor memory device according to claim 1, wherein a third silicide layer is formed by said siliciding the upper portion of the plug, said third silicide layer abutting the second spacer.

9. The method of manufacturing the semiconductor memory device according to claim 1, wherein an upper surface of the second spacer is exposed.

10. The method of manufacturing the semiconductor memory device according to claim 1, further comprising:
    forming an insulating film between the floating gate and the plug.

11. The method of manufacturing the semiconductor memory device according to claim 10, wherein the insulating film abuts the plug and the first spacer.

12. The method of manufacturing the semiconductor memory device according to claim 11, wherein the insulating film further abuts the second spacer.

13. The method of manufacturing the semiconductor memory device according to claim 12, wherein a third silicide layer is formed by said siliciding the upper portion of the plug, and
    wherein, in a plan view, the insulating film overlaps with the third silicide layer.

14. The method of manufacturing the semiconductor memory device according to claim 10, wherein a third silicide layer is formed by said siliciding the upper portion of the plug, and
    wherein, in a plan view, the insulating film is located inside the third silicide layer such that the plug spaces apart the insulating film from an edge of the third silicide layer.

15. The method of manufacturing the semiconductor memory device according to claim 10, wherein opposing surfaces of the insulating film abut the floating gate and the plug.

16. The method of manufacturing the semiconductor memory device according to claim 15, wherein an upper surface of the second spacer is exposed.

17. The method of manufacturing the semiconductor memory device according to claim 1, wherein the side wall insulative film separates the first silicide layer and the second silicide layer.

18. The method of manufacturing the semiconductor memory device according to claim 1, wherein the side wall insulative film abuts the first silicide layer and the second silicide layer.

* * * * *